(12) United States Patent
Lin et al.

(10) Patent No.: US 11,178,752 B2
(45) Date of Patent: Nov. 16, 2021

(54) CIRCUIT BOARD WITH ELECTROSTATIC DISCHARGE PROTECTION MECHANISM AND ELECTRONIC APPARATUS HAVING THE SAME

(71) Applicant: PEGATRON CORPORATION, Taipei (TW)

(72) Inventors: Bo-Yu Lin, Taipei (TW); Ping-Chung Wu, Taipei (TW); Wei-Chun Tsao, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 242 days.

(21) Appl. No.: 16/226,473

(22) Filed: Dec. 19, 2018

(65) Prior Publication Data

US 2019/0215949 A1    Jul. 11, 2019

(30) Foreign Application Priority Data

Jan. 11, 2018    (TW) .................................. 107101119

(51) Int. Cl.
*H05K 1/02*    (2006.01)
*H05K 9/00*    (2006.01)
(Continued)

(52) U.S. Cl.
CPC .......... *H05K 1/026* (2013.01); *H05K 9/0067* (2013.01); *H01T 4/08* (2013.01); *H01T 4/10* (2013.01);
(Continued)

(58) Field of Classification Search
CPC ................. H05K 1/026; H05K 9/0067; H05K 2201/09354; H05K 1/0219; H05K 1/181;
(Continued)

(56) References Cited

U.S. PATENT DOCUMENTS 6,493,198 B1    12/2002  Arledge et al.
9,699,900 B2     7/2017  Park
(Continued)

FOREIGN PATENT DOCUMENTS

CN    1310578    8/2001
EP    1986297    10/2008
(Continued)

OTHER PUBLICATIONS

"Search Report of Europe Counterpart Application", dated Jun. 7, 2019, pp. 1-9.
(Continued)

*Primary Examiner* — Nguyen Tran
*Assistant Examiner* — Trinh Q Dang
(74) *Attorney, Agent, or Firm* — J.C. Patents

(57) ABSTRACT

A circuit board with an electrostatic discharge protection mechanism and an electronic apparatus having the same are provided. The circuit board includes a substrate, at least one signal trace, and a conductive element. The at least one signal trace is disposed on the substrate. The conductive element is electrically connected to a ground plane of the substrate and crosses over the at least one signal trace. The conductive element has at least one discharging portion. The position of the at least one discharging portion corresponds to the at least one signal trace. A gap exists between the at least one discharging portion and the at least one signal trace. A static electricity of the at least one signal trace is discharged to the at least one discharging portion.

6 Claims, 3 Drawing Sheets

(51) Int. Cl.
*H05K 1/18* (2006.01)
*H01T 4/08* (2006.01)
*H01T 4/10* (2006.01)

(52) U.S. Cl.
CPC ............ *H05K 1/0219* (2013.01); *H05K 1/181* (2013.01); *H05K 2201/09236* (2013.01); *H05K 2201/09354* (2013.01); *H05K 2201/10363* (2013.01)

(58) Field of Classification Search
CPC ....... H05K 2201/09236; H05K 1/0254; H05K 1/0259; H01T 4/08; H01T 4/10
See application file for complete search history.

(56) References Cited

U.S. PATENT DOCUMENTS

| | | | | |
|---|---|---|---|---|
| 2006/0266544 | A1* | 11/2006 | Tung | H05K 9/0067 |
| | | | | 174/250 |
| 2008/0158766 | A1 | 7/2008 | Oyama | |
| 2011/0102326 | A1* | 5/2011 | Casparian | G06F 3/016 |
| | | | | 345/168 |
| 2012/0199381 | A1* | 8/2012 | Heo | H05K 7/205 |
| | | | | 174/252 |
| 2016/0143159 | A1 | 5/2016 | Park | |
| 2018/0019192 | A1* | 1/2018 | Chen | H01L 23/3128 |
| 2018/0021803 | A1* | 1/2018 | Nauchi | B05D 1/26 |
| | | | | 427/58 |

FOREIGN PATENT DOCUMENTS

| | | |
|---|---|---|
| JP | S55158190 | 11/1980 |
| JP | H0286165 | 7/1990 |
| JP | H404244732 | 9/1992 |
| JP | H11354249 | 12/1999 |
| JP | 2005505188 | 2/2005 |
| JP | 2008166099 | 7/2008 |
| KR | 20160060218 | 5/2016 |
| TW | M352173 | 3/2009 |
| TW | 201140529 | 11/2011 |

OTHER PUBLICATIONS

"Office Action of Japan Counterpart Application", dated Jun. 25, 2019, pp. 1-2.

"Office Action of Korea Counterpart Application" with English translation thereof, dated Jan. 28, 2020, p. 1-p. 10.

* cited by examiner

CIRCUIT BOARD WITH ELECTROSTATIC DISCHARGE PROTECTION MECHANISM AND ELECTRONIC APPARATUS HAVING THE SAME

CROSS REFERENCE TO RELATED APPLICATION

This application claims the priority benefit of Taiwan application serial no. 107101119, filed on Jan. 11, 2018. The entirety of the above-mentioned patent application is hereby incorporated by reference herein and made a part of specification.

BACKGROUND

Technical Field

The application relates to a circuit board. More particularly, the application relates to a circuit board with an electrostatic discharge protection mechanism and an electronic apparatus having the same.

Description of Related Art

Generally, signal traces of a circuit board are usually provided with electrostatic discharge (ESD) protection components, such as varistors, zener diodes or transient voltage suppressors (TVS), etc., to avoid a malfunction or permanent damage which occurs to electronic components of the circuit board or the entire electronic apparatus due to electrical overstress (EOS).

However, since the ESD protection components are disposed on the circuit board and the sizes of the ESD protection components are fixed, the ESD protection components usually occupy a part of the area of the circuit board, such that the area available for wiring on the circuit board will be reduced and the layout of the signal traces of the circuit board is limited. In addition, once the layout of the signal traces of the circuit board is completed, if additional ESD protection components need to be added to the circuit board based on specific factors, there may be insufficient areas available for the additional ESD protection components, which will be detrimental to the flexibility of the circuit board design.

SUMMARY

In view of the above, the application provides a circuit board with an electrostatic discharge (ESD) protection mechanism and an electronic apparatus having the same which can realize the function of electrostatic discharge protection without affecting the layout of signal traces of the circuit board so as to enhance the flexibility of the circuit board design.

The circuit board with the electrostatic discharge protection mechanism of the application comprises a substrate, at least one signal trace, and a conductive element. The at least one signal trace is disposed on the substrate. The conductive element is electrically connected to a ground plane of the substrate and crosses over the at least one signal trace. The conductive element has at least one discharging portion. A position of the at least one discharging portion corresponds to the at least one signal trace. A gap exists between the at least one discharging portion and the at least one signal trace. A static electricity of the at least one signal trace is discharged to the at least one discharging portion.

In an embodiment of the application, a minimum discharge voltage at which the static electricity of the at least one signal trace is discharged to the at least one discharging portion is determined according to a distance of the gap.

In an embodiment of the application, the minimum discharge voltage is determined according to the following formula:

$$Vd = \frac{B \times P \times D}{\ln(P \times D) + k},$$

where Vd is the minimum discharge voltage, B is a constant, P is an atmospheric pressure value, D is the distance of the gap, and k is a parameter associated with the atmospheric pressure value and the distance of the gap.

In an embodiment of the application, the at least one discharging portion is a saw-toothed structure, and the distance of the gap is a distance from a tip end of the saw-toothed structure to the at least one signal trace.

In an embodiment of the application, the at least one discharging portion is an acicular structure, and the distance of the gap is a distance from a tip end of the acicular structure to the at least one signal trace.

The electronic apparatus of the application comprises the above-mentioned circuit board with the electrostatic discharge protection mechanism.

To sum up, according to the circuit board with the electrostatic discharge protection mechanism and the electronic apparatus having the same provided by the embodiments of the application, the conductive element is stereoscopically disposed on the ground plane of the substrate and crosses over the signal trace so as to perform electrostatic discharge protection on the signal trace. Since the conductive component does not occupy the area for wiring on the substrate, the electrostatic discharge protection function can be realized without affecting the layout of the signal trace of the circuit board, thereby effectively improving the flexibility of the circuit board design.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION

Figure 1:
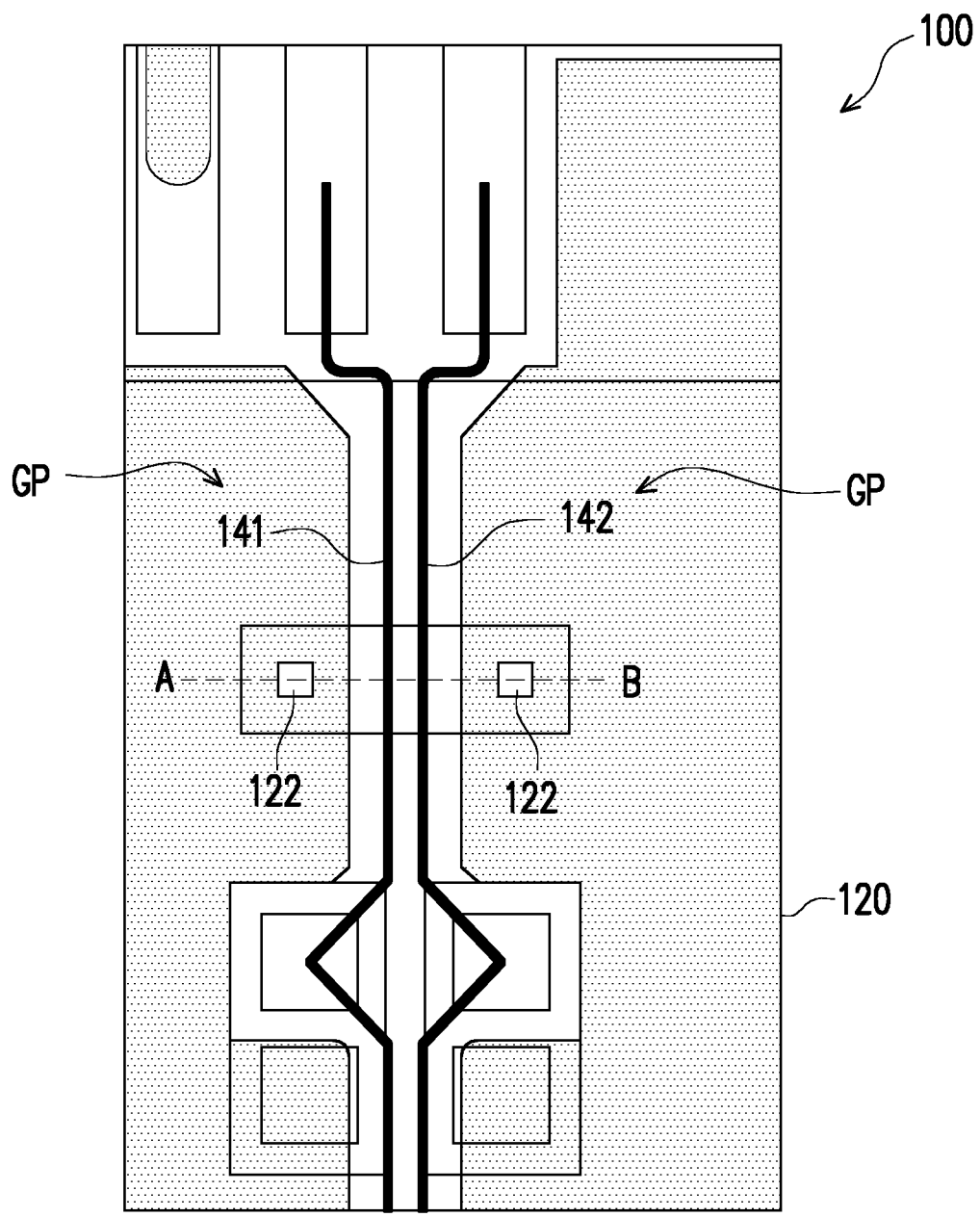
FIG. 1 is a schematic diagram illustrating a layout of a part of a circuit board with an electrostatic discharge protection mechanism according to an embodiment of the application.

In order to make the application more comprehensible, several embodiments are described below as examples of implementation of the application. In addition, wherever possible, identical or similar reference numerals stand for identical or similar elements/components in the drawings and the embodiments.

Figure 2:
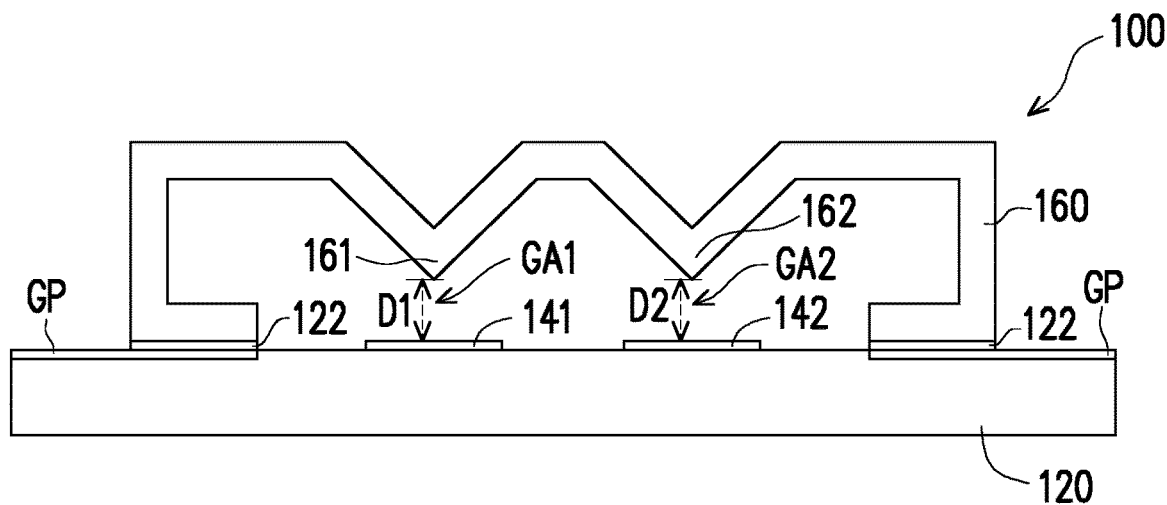
FIG. 2 is a cross-sectional view of the circuit board with the electrostatic discharge protection mechanism along a section line A-B of FIG. 1 according to an embodiment of the application.

Please refer to FIG. 1 and FIG. 2 together, FIG. 1 is a schematic diagram illustrating a layout of a part of a circuit board with an electrostatic discharge protection mechanism according to an embodiment of the application, and FIG. 2 is a cross-sectional view of the circuit board with the electrostatic discharge protection mechanism along a section line A-B of FIG. 1 according to an embodiment of the application. The circuit board 100 includes a substrate 120, at least one signal trace, and a conductive element 160, wherein the conductive element 160 has at least one discharging portion. For illustrative convenience, the embodiment of FIG. 1 and FIG. 2 takes only two signal traces 141 and 142 and corresponding two discharging portions 161 and 162 as an example for elaboration shown in. Other embodiments in which one signal trace may be equipped with a corresponding discharging portion, or three or more signal traces may be equipped with three or more corresponding discharging portions, and so on can be derived according to the description as follows.

Signal traces 141 and 142 are disposed on the substrate 120. The conductive element 160 is electrically connected to a ground plane GP of the substrate 120 and disposed across the signal traces 141 and 142, as shown in FIG. 2. In detail, the ground plane GP of the substrate 120 is provided with a pad 122, and two ends of the conductive element 160 are soldered to the pad 122 by a solder, which allows the conductive element 160 to be electrically connected to the ground plane GP. The position of the discharging portion 161 corresponds to the signal trace 141, and a gap GA1 exists between the discharging portion 161 and the signal trace 141. A static electricity of the signal trace 141 could be discharged to the discharging portion 161 through the gap GA1, and is dissipated to the ground plane GP through the discharging portion 161. Similarly, the position of the discharging portion 162 corresponds to the signal trace 142, and a gap GA2 is exists between the discharging portion 162 and the signal trace 142. A static electricity of the signal trace 142 could be discharged to the discharging portion 162 through the gap GA2, and is dissipated to the ground plane GP through the discharging portion 162. It can be understood that the electrostatic discharge protection function of the circuit board 100 is achieved by means of are discharge between the signal trace 141 and the discharging portion 161 (or the signal trace 142 and the discharging portion 162).

Since the conductive element 160 is stereoscopically disposed on the ground plane GP of the substrate 120 and crosses over the signal traces 141, 142, the conductive element 160 does not occupy the area for wiring on the substrate 120. In this way, the conductive element 160 realizes the function of electrostatic discharge protection without affecting the layout of the signal traces of the circuit board 100, so that the flexibility of the design of the circuit board 100 can be improved.

In the embodiment shown in FIG. 2, each of the discharging portions 161 and 162 is a saw-toothed structure, but the application is not limited thereto. The application does not limit the shape of the discharging portions 161 and 162 as long as they could realize the function of electrostatic discharge protection.

In an embodiment of the application, a minimum discharge voltage at which the static electricity of the signal trace 141 is (arc discharge) discharged to the discharging portion 161 is determined according to a distance D1 of the gap GA1. The distance D1 of the gap GA1 is a (shortest) distance from a tip end of the saw-toothed structure of the discharging portion 161 to the signal trace 141. Similarly, a minimum discharge voltage at which the static electricity of the signal trace 142 is (arc discharge) discharged to the discharging portion 162 is determined according to a distance D2 of the gap GA2. The distance D2 of the gap GA2 is a (shortest) distance from a tip end of the saw-toothed structure of the discharging portion 162 to the signal trace 142.

Further, the minimum discharge voltage at which the static electricity of the signal trace 141 is (arc discharge) discharged to the discharging portion 161 can be estimated according to Paschen's law. Paschen's law is shown as the following formula (1), where Vd is the minimum discharge voltage, B is a constant, P is an atmospheric pressure value of the environment in which the circuit board 100 is located, D is the distance D1 of the gap GA1, and k is a parameter associated with the atmospheric pressure value P and the distance D1 of the gap GA1.

$$Vd = \frac{B \times P \times D}{\ln(P \times D) + k} \quad \text{formula (1)}$$

In detail, if the value of P×D in the formula (1) is between 0.0133 kPa-cm and 0.2 kPa-cm, the parameter k in the formula (1) may be determined according to the following formula (2). Further, if the value of P×D in the formula (1) is between 0.2 kPa-cm and 100 kPa-cm, the parameter k in the formula (1) can be determined according to the following formula (3). The constant B can be, for example, 2737.5 V/(kPa-cm), but the application is not limited thereto.

$$k = 2.0583(P \times D)^{-0.1724} \quad \text{formula (2)}$$

$$k = 3.5134(P \times D)^{-0.0599} \quad \text{formula (3)}$$

Therefore, by knowing the atmospheric pressure of the environment in which the circuit board 100 is located and the distance D1 of the gap GA1 between the signal trace 141 and the discharging portions 161, the minimum discharge voltage at which the static electricity of the signal trace 141 starts is (arc discharge) discharged to the discharging portion 161 can be derived by the formula (1) to formula (3). That is, once the voltage on the signal trace 141 rises to be greater than or equal to the minimum discharge voltage, the gas of the gap GA1 will undergo an electrical breakdown phenomenon, causing the electric charges of the signal trace 141 to be discharged to the discharging portion 161. Similarly, the minimum discharge voltage at which the static electricity of the signal trace 142 starts to be (arc) discharged to the discharging portion 162 can be analogized according to the above description, and therefore will not be repeated again.

Figure 3:
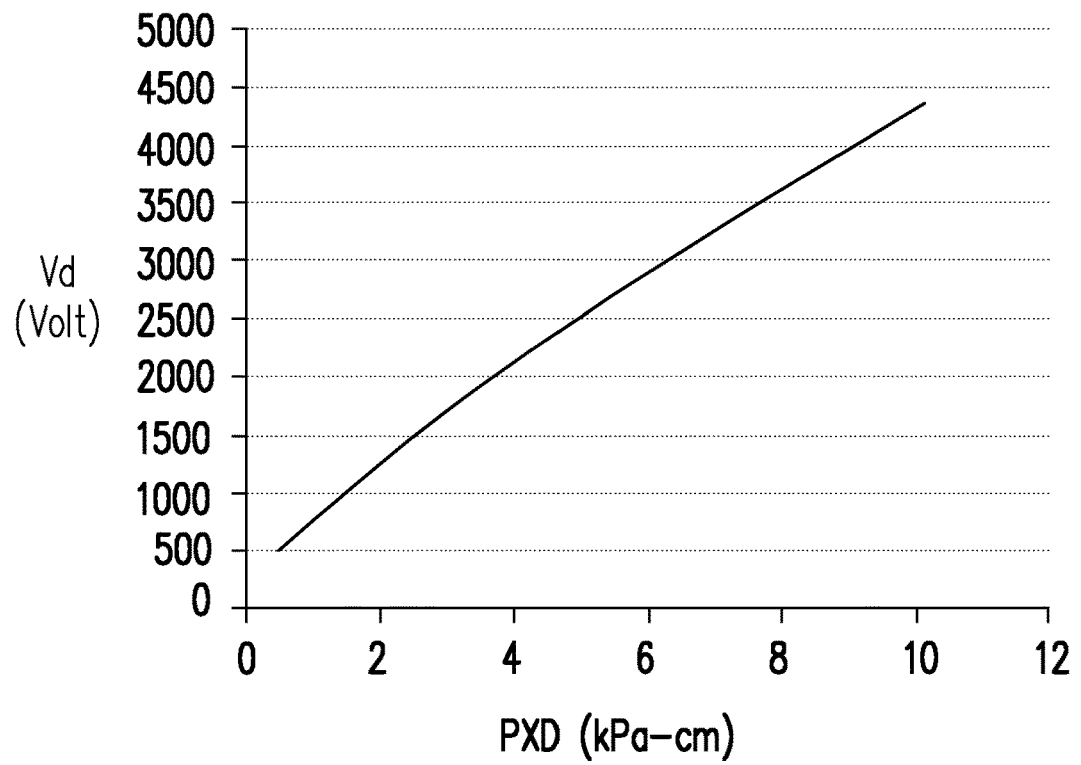
FIG. 3 is a schematic diagram illustrating a relationship between the value of P×D and a minimum discharge voltage according to an embodiment of the application.

Please refer to FIG. 2 and FIG. 3 together, FIG. 3 is a schematic diagram illustrating a relationship between the value of P×D and a minimum discharge voltage according to an embodiment of the application. As can be seen from FIG. 3, the value of P×D is proportional to the aforementioned minimum discharge voltage. That is to say, the larger the value of P×D, the higher the above-mentioned minimum discharge voltage, and vice versa. Therefore, in the case that the atmospheric pressure value P does not change, adjusting the distance D1 of the gap GA1 of FIG. 2 according to actual application or design requirements can achieve the same effect of adjusting the minimum discharge voltage at which the static electricity of the signal trace 141 starts to be (arc discharge) discharged to the discharging portion 161. Alternatively, adjusting the distance D2 of the gap GA2 of FIG. 2 can achieve the same effect of adjusting the minimum discharge voltage at which the static electricity of the signal trace 142 starts to be (arc) discharged to the discharging portion 162 as well.

Figure 4:
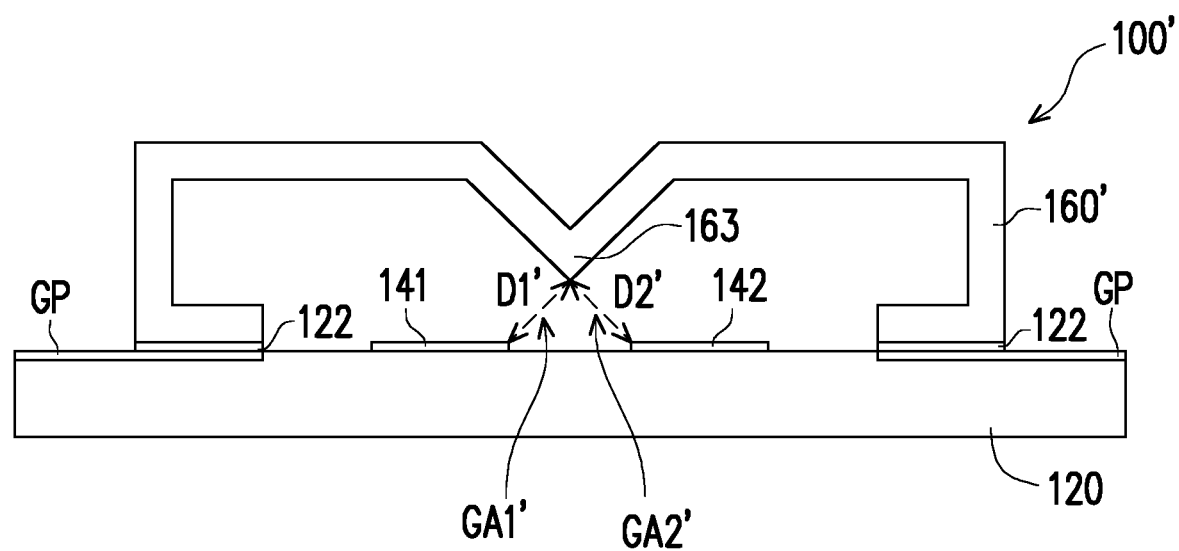
FIG. 4 is a cross-sectional view of the circuit board with the electrostatic discharge protection mechanism along a section line A-B of FIG. 1 according to another embodiment of the application.

Please refer to FIG. 2 and FIG. 4 together. FIG. 4 is a cross-sectional view of the circuit board with the electrostatic discharge protection mechanism along a section line A-B of FIG. 1 according to another embodiment of the application. Similar to the circuit board 100 of FIG. 2, the circuit board 100' of FIG. 4 also includes a substrate 120, signal traces 141 and 142, and a conductive element 160'. The difference between the circuit board 100 of FIG. 2 and the circuit board 100' of FIG. 4 only is that the conductive element 160 of FIG. 2 has two discharging portions 161, 162, whereas the conductive element 160' of FIG. 4 has only one discharging portion 163. The position of the discharging portion 163 of FIG. 4 corresponds to the signal traces 141 and 142. A gap GA1' is formed between the discharging portion 163 and the signal trace 141, wherein the distance D1' of the gap GA1' is the (shortest) distance from the tip end of the saw-toothed structure of the discharging portion 163 to the signal trace 141. The static electricity of the signal trace 141 is discharged to the discharging portion 163 through the gap GA1', and is dissipated to the ground plane GP through the discharging portion 163. Similarly, there is a gap GA2' between the discharging portion 163 and the signal trace 142, wherein the distance D2' of the gap GA2' is the (shortest) distance from the tip end of the saw-toothed structure of the discharging portion 163 to the signal trace 142. The static electricity of the signal trace 142 is discharged to the discharging portion 163 through the gap GA2', and is dissipated to the ground plane GP through the discharging portion 163. In addition, other implementation details of the circuit board 100' of FIG. 4 can be derived from the related descriptions of FIG. 1 to FIG. 3, and therefore will not be repeated again.

Figure 5:
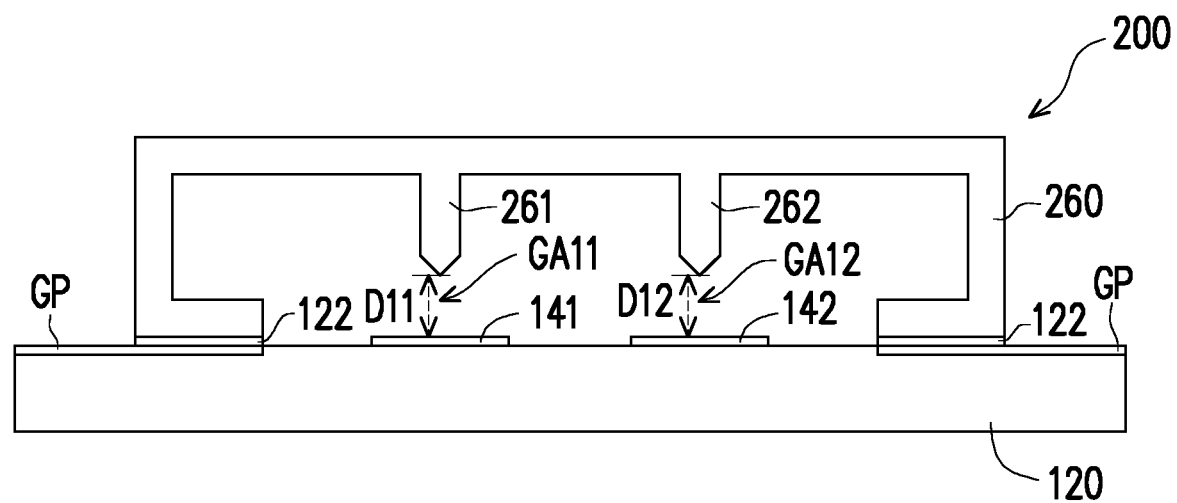
FIG. 5 is a cross-sectional view of the circuit board with the electrostatic discharge protection mechanism along a section line A-B of FIG. 1 according to yet another embodiment of the application.

Please refer to FIG. 2 and FIG. 5 together, FIG. 5 is a cross-sectional view of the circuit board with the electrostatic discharge protection mechanism along a section line A-B of FIG. 1 according to yet another embodiment of the application. Similar to the circuit board 100 of FIG. 2, the circuit board 200 of FIG. 5 also includes a substrate 120, signal traces 141 and 142, and a conductive element 260. The difference between the circuit board 100 of FIG. 2 and the circuit board 200 of FIG. 5 only is that the discharging portions 161 and 162 are saw-toothed structures, whereas the discharging portion 261 and 262 are acicular structures. A gap GA11 is formed between the discharging portion 261 and the signal trace 141, wherein the distance D11 of the gap GA11 is the (shortest) distance from the tip end of the acicular structure of the discharging portion 261 to the signal trace 141. The static electricity of the signal trace 141 is discharged to the discharging portion 261 through the gap GA11, and is dissipated to the ground plane GP through the discharging portion 261. Similarly, there is a gap GA12 between the discharging portion 262 and the signal trace 142, wherein the distance D12 of the gap GA12 is the (shortest) distance from the tip end of the acicular structure of the discharging portion 262 to the signal trace 142. The static electricity of the signal trace 142 is discharged to the discharging portion 262 through the gap GA12, and is dissipated to the ground plane GP through the discharging portion 262. In addition, other implementation details of the circuit board 200 of FIG. 5 can be derived to the related descriptions of FIG. 1 to FIG. 3, and therefore will not be repeated again.

The circuit board with the electrostatic discharge protection mechanism mentioned in the above embodiments of the application can be used in, for example but not limited to, various types of electronic apparatuses, such as a server, a personal computer, a notebook computer, a tablet computer, mobile phones, smart phones, personal digital assistants (PDAs), digital music players, or wired or wireless electronic devices. In this way, the electronic components inside the electronic apparatus can be prevented from being subjected to electrical overstress to cause malfunction or permanent destruction.

In view of the foregoing, in the circuit board with the electrostatic discharge protection mechanism and the electronic apparatus having the same provided by the embodiments of the application, the conductive element is stereoscopically disposed on the ground plane of the substrate and disposed across the signal trace so as to perform ESD protection on the signal trace. Since the conductive component does not occupy the area for wiring on the substrate, the ESD protection function can be realized without affecting the layout of the signal traces of the circuit board, thereby effectively improving the flexibility of the circuit board design.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A circuit board with an electrostatic discharge protection mechanism comprising:
    a substrate;
    at least one signal trace, disposed on the substrate, configured to transmit an electrical signal; and
    a conductive element, electrically connected to a ground plane of the substrate and crossing over the at least one signal trace, wherein the conductive element has at least one discharging portion, a position of the at least one discharging portion corresponds to the at least one signal trace, and a gap exists between the at least one discharging portion and the at least one signal trace, wherein a static electricity of the at least one signal trace is discharged to the at least one discharging portion, wherein the conductive element is an electrically conductive element,
    wherein a minimum discharge voltage at which the static electricity of the at least one signal trace is discharged to the at least one discharging portion is determined according to a distance of the gap,
    wherein the minimum discharge voltage is determined according to the following formula:

$$Vd = \frac{B \times P \times D}{\ln(P \times D) + k},$$

wherein Vd is the minimum discharge voltage, B is a constant, P is an atmospheric pressure value, D is the distance of the gap, and k is a parameter associated with the atmospheric pressure value and the distance of the gap.

2. The circuit board with the electrostatic discharge protection mechanism as claimed in claim 1, wherein the at least one discharging portion is a saw-toothed structure, and the distance of the gap is a distance from a tip end of the saw-toothed structure to the at least one signal trace.

3. The circuit board with the electrostatic discharge protection mechanism as claimed in claim 1, wherein the at least one discharging portion is an acicular structure, and the distance of the gap is a distance from a tip end of the acicular structure to the at least one signal trace.

4. An electronic apparatus, comprising:
   a circuit board comprising:
   a substrate;
   at least one signal trace, disposed on the substrate, configured to transmit an electrical signal; and
   a conductive element, electrically connected to a ground plane of the substrate and crossing over the at least one signal trace, wherein the conductive element has at least one discharging portion, a position of the at least one discharging portion corresponds to the at least one signal trace, and a gap exists between the at least one discharging portion and the at least one signal trace, wherein a static electricity of the at least one signal trace is discharged to the at least one discharging portion, wherein the conductive element is an electrically conductive element,
   wherein a minimum discharge voltage at which the static electricity of the at least one signal trace is discharged to the at least one discharging portion is determined according to a distance of the gap,
   wherein the minimum discharge voltage is determined according to the following formula:

$$Vd = \frac{B \times P \times D}{\ln(P \times D) + k},$$

wherein Vd is the minimum discharge voltage, B is a constant, P is an atmospheric pressure value, D is the distance of the gap, and k is a parameter associated with the atmospheric pressure value and the distance of the gap.

5. The electronic apparatus as claimed in claim 4, wherein the at least one discharging portion is a saw-toothed structure, and the distance of the gap is a distance from a tip end of the saw-toothed structure to the at least one signal trace.

6. The electronic apparatus as claimed in claim 4, wherein the at least one discharging portion is an acicular structure, and the distance of the gap is a distance from a tip end of the acicular structure to the at least one signal trace.

* * * * *